US012601977B2

(12) United States Patent
Chang et al.

(10) Patent No.: US 12,601,977 B2
(45) Date of Patent: Apr. 14, 2026

(54) OPTIMIZATION METHOD FOR MASK PATTERN OPTICAL TRANSFER

(71) Applicant: UNITED MICROELECTRONICS CORP., Hsinchu (TW)

(72) Inventors: Chun-Yi Chang, Taichung City (TW); Wen-Liang Huang, Hsinchu City (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 827 days.

(21) Appl. No.: 17/983,610

(22) Filed: Nov. 9, 2022

(65) Prior Publication Data

US 2024/0094638 A1 Mar. 21, 2024

(30) Foreign Application Priority Data

Sep. 20, 2022 (CN) .......................... 202211148267.6

(51) Int. Cl.
G03F 7/00 (2006.01)

(52) U.S. Cl.
CPC .......... G03F 7/705 (2013.01); G03F 7/70125 (2013.01)

(58) Field of Classification Search
CPC ... G03F 7/705; G03F 7/70125; G03F 7/70683
See application file for complete search history.

(56) References Cited

U.S. PATENT DOCUMENTS

| | | |
|---|---|---|
| 7,111,277 B2 | 9/2006 | Ye |
| 7,180,576 B2 | 2/2007 | Hansen |
| 7,471,375 B2 | 12/2008 | Finders |
| 9,091,941 B2 | 7/2015 | Smith |
| 2005/0097500 A1* | 5/2005 | Ye ............................. G03F 7/705 716/52 |
| 2010/0135569 A1* | 6/2010 | Berger ................ G03F 7/70125 382/144 |
| 2011/0230999 A1* | 9/2011 | Chen ........................ G03F 7/705 700/105 |
| 2012/0137260 A1* | 5/2012 | Pang .......................... G03F 1/36 716/52 |

(Continued)

OTHER PUBLICATIONS

Li et al., "Joint optimization of source, mask and pupil in optical lithography" (Mar. 2014), Proceedings vol. 9052, Optical Microlithography XXVII, p. 1-9 [retrieved from https://www.spiedigitallibrary.org/conference-proceedings-of-spie/9052/90520S/]. (Year: 2014).*

*Primary Examiner* — Brian W Wathen
(74) *Attorney, Agent, or Firm* — WPAT, PC

(57) ABSTRACT

An optimization method for a mask pattern optical transfer includes steps as follows: First, a projection optical simulation is performed to obtain an optimal pupil configuration scheme corresponding to a virtual mask pattern. Next, a position scanning is performed to change the optimal pupil configuration scheme, so as to generate a plurality of adjusted pupil configuration schemes. A mask pattern transfer simulation is performed to obtain a plurality of pupil configuration schemes-critical dimension relationship data corresponding to the virtual mask pattern. Subsequently, an actual pupil configuration scheme suitable for an actual mask pattern is selected according to the plurality of pupil configuration schemes-critical dimension relationship data, and upon which an actual mask pattern transfer is performed.

6 Claims, 2 Drawing Sheets

(56) References Cited

U.S. PATENT DOCUMENTS

| | | | | |
|---|---|---|---|---|
| 2015/0118602 | A1* | 4/2015 | Liou | G03F 1/50 |
| | | | | 430/5 |
| 2016/0202619 | A1* | 7/2016 | Tyminski | G03F 7/70616 |
| | | | | 430/30 |
| 2017/0228490 | A1* | 8/2017 | Chung | G06F 30/398 |
| 2017/0248841 | A1* | 8/2017 | Tanabe | G03F 1/50 |
| 2020/0326632 | A1* | 10/2020 | Fang | G03F 7/70508 |
| 2021/0088915 | A1* | 3/2021 | Wang | G03F 7/705 |
| 2021/0349404 | A1* | 11/2021 | Conley | G03F 7/70575 |
| 2022/0293413 | A1* | 9/2022 | Chang | H01L 21/3086 |
| 2023/0076218 | A1* | 3/2023 | Van Ingen Schenau | |
| | | | | G03F 7/70641 |
| 2023/0408932 | A1* | 12/2023 | Coskun | G03F 9/7046 |
| 2024/0004305 | A1* | 1/2024 | Tao | G03F 7/70441 |
| 2024/0119212 | A1* | 4/2024 | Ser | G03F 1/70 |

* cited by examiner

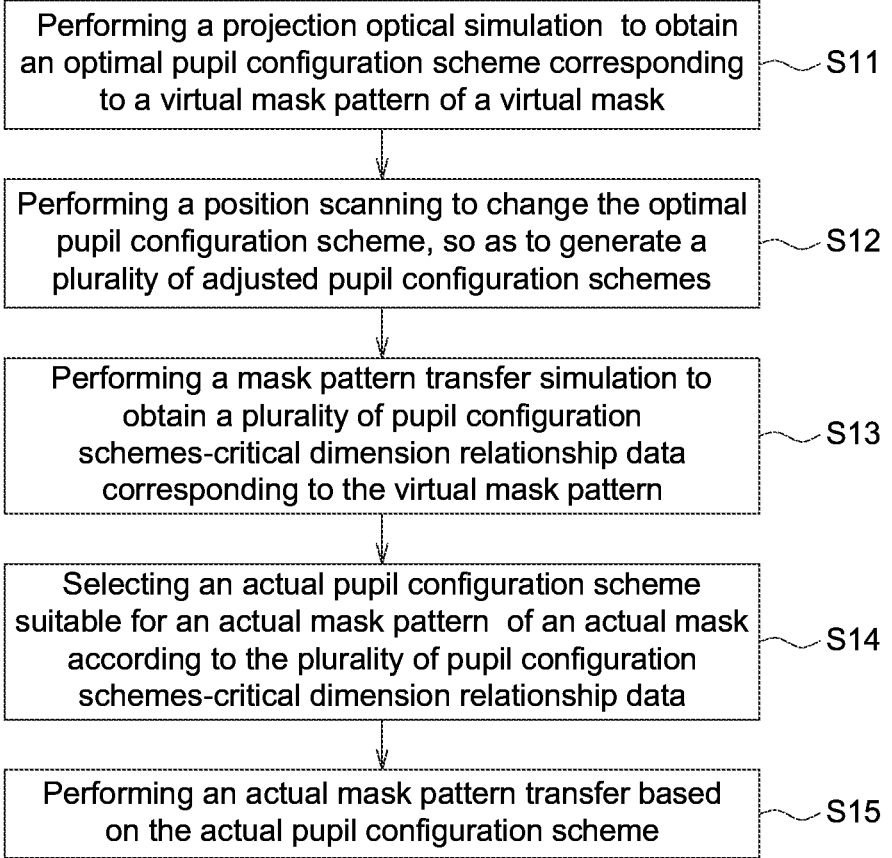

Performing a projection optical simulation  to obtain an optimal pupil configuration scheme corresponding to a virtual mask pattern of a virtual mask          S11

Performing a position scanning to change the optimal pupil configuration scheme, so as to generate a plurality of adjusted pupil configuration schemes          S12

Performing a mask pattern transfer simulation to obtain a plurality of pupil configuration schemes-critical dimension relationship data corresponding to the virtual mask pattern          S13

Selecting an actual pupil configuration scheme suitable for an actual mask pattern  of an actual mask according to the plurality of pupil configuration schemes-critical dimension relationship data          S14

Performing an actual mask pattern transfer based on the actual pupil configuration scheme          S15

OPTIMIZATION METHOD FOR MASK PATTERN OPTICAL TRANSFER

This application claims the benefit of People's Republic of China application Serial No. 202211148267.6 filed Sep. 20, 2022, the subject matter of which is incorporated herein by reference.

BACKGROUND

Technical Field

The disclosure relates to an optimization method for a semiconductor process, and more particularly to an optimization method for a mask pattern optical lithography process.

Description of Background

Optical lithography is a process of printing circuit patterns onto semiconductor wafers, such as silicon or gallium arsenide (GaAs) wafers, and is one of the main techniques used in semiconductor fabrication. In an optical lithography process, certain patterns and features are first formed on a reticle by using an electron beam or laser beam direct writing tool. Next, light source (e.g., ultraviolet (UV) or deep ultraviolet (DUV)) beams are uniformly incident on the reticle after passing through a first set of lenses. The originally uniform incident light becomes a separate multi-channel diffracted light after passing through the reticle, due to a diffraction effect (diffraction) of the reticle. After collected by a second group of projection lenses, the separate multi-channel diffracted lights are focused to form an image projected on a photoresist layer coated on the wafer, so that the pattern on the reticle can be transferred to the photoresist layer coated on the wafer.

As the critical dimensions of semiconductor patterns become smaller and smaller, the lithography process becomes more challenging. In order to improve the pattern quality of the image projected onto the semiconductor wafer, resolution enhancement technologies (REI) have been adopted to improve the projected pattern resolution. There are three commonly used resolution enhancement technologies, namely optical proximity effect correction (OPC) technology, phase shifting mask (PSM) technology and off-axis illumination technology (OAI) technology.

Taking OAI technology as an example, a metal pupil filter, acting as a diffraction grating, is combined with a lens of a projection system illuminator to provide an oblique illumination for irradiating the reticle. After passing through the pattern configured on the pupil filter (for example, with two or four symmetrically arranged openings), the radiation beam may make a specific angle with the optical axis of the projection system to increase the diffraction order of the radiation beam. Thereby the contrast resolution of the image can be improved.

However, applying the OAI technology, may lead a significant intensity loss of the light passing through the reticle, which negatively affects other optical parameters and the image quality. In addition, prior to the reticle pattern is actually transferred to the wafer, a trial-and-error study is still required in the initial stage to find a pupil configuration scheme suitable for the reticle pattern. It not only affects the operation stability of the lithography process, reduces the process yield, but also increases the manufacturing cost.

Therefore, there is a need of providing an advanced optimization method for a mask pattern optical transfer to obviate the drawbacks encountered from the prior art.

SUMMARY

One aspect of the present disclosure is to provide an optimization method for a mask pattern optical transfer, wherein the method includes steps as follows: First, a projection optical simulation is performed to obtain an optimal pupil configuration scheme corresponding to a virtual mask pattern. Next, a position scanning is performed to change the optimal pupil configuration scheme, so as to generate a plurality of adjusted pupil configuration schemes. A mask pattern transfer simulation is performed to obtain a plurality of pupil configuration schemes-critical dimension relationship data corresponding to the virtual mask pattern. Subsequently, an actual pupil configuration scheme suitable for an actual mask pattern is selected according to the plurality of pupil configuration schemes-critical dimension relationship data, and upon which an actual mask pattern transfer is performed.

In accordance with the aforementioned embodiments of the present disclosure, an optimization method for a mask pattern optical transfer is provided. Firstly, a projection optical simulation is performed to obtain an optimal pupil configuration scheme corresponding to a virtual mask pattern. Then, a position scanning is performed based on the optimal pupil configuration scheme to define a plurality of scanning positions on the pupil filter. And the parameters of the optimal pupil configuration scheme (for example, the shape and layout of the aperture pattern, the size or the illumination intensity of the light source, etc.) at each of the scanning positions are adjusted to obtain a plurality of adjusted pupil configuration schemes.

Then, a mask pattern transfer simulation is performed based on these adjusted pupil configuration schemes to obtain a plurality of pupil configuration schemes-critical dimension relationship data corresponding to the virtual mask pattern, and store them in a data storage. These steps aforementioned are repeated to obtain a plurality of pupil configuration schemes-critical dimension relationship data corresponding to a plurality of other virtual mask patterns. After accumulating enough data, a database can be formed to characterize the tripartite relationships among these mask patterns, pupil configuration schemes and the critical dimension.

When an actual mask pattern transfer is carried out, an actual mask pattern to be transferred can be preliminarily prepared according to these tripartite relationships among these mask patterns, pupil configuration schemes and the critical dimension stored in the database, and a pupil configuration scheme more suitable for the actual mask pattern can be then selected for directly performing the actual mask pattern transfer.

BRIEF DESCRIPTION OF THE DRAWINGS

The above objects and advantages of the present disclosure will become more readily apparent to those ordinarily skilled in the art after reviewing the following detailed description and accompanying drawings, in which:

FIG. 1 is a processing flowchart illustrating an optimization method of a mask patterns optical transfer according to one embodiment of the present disclosure.

DETAILED DESCRIPTION

Figure 2:
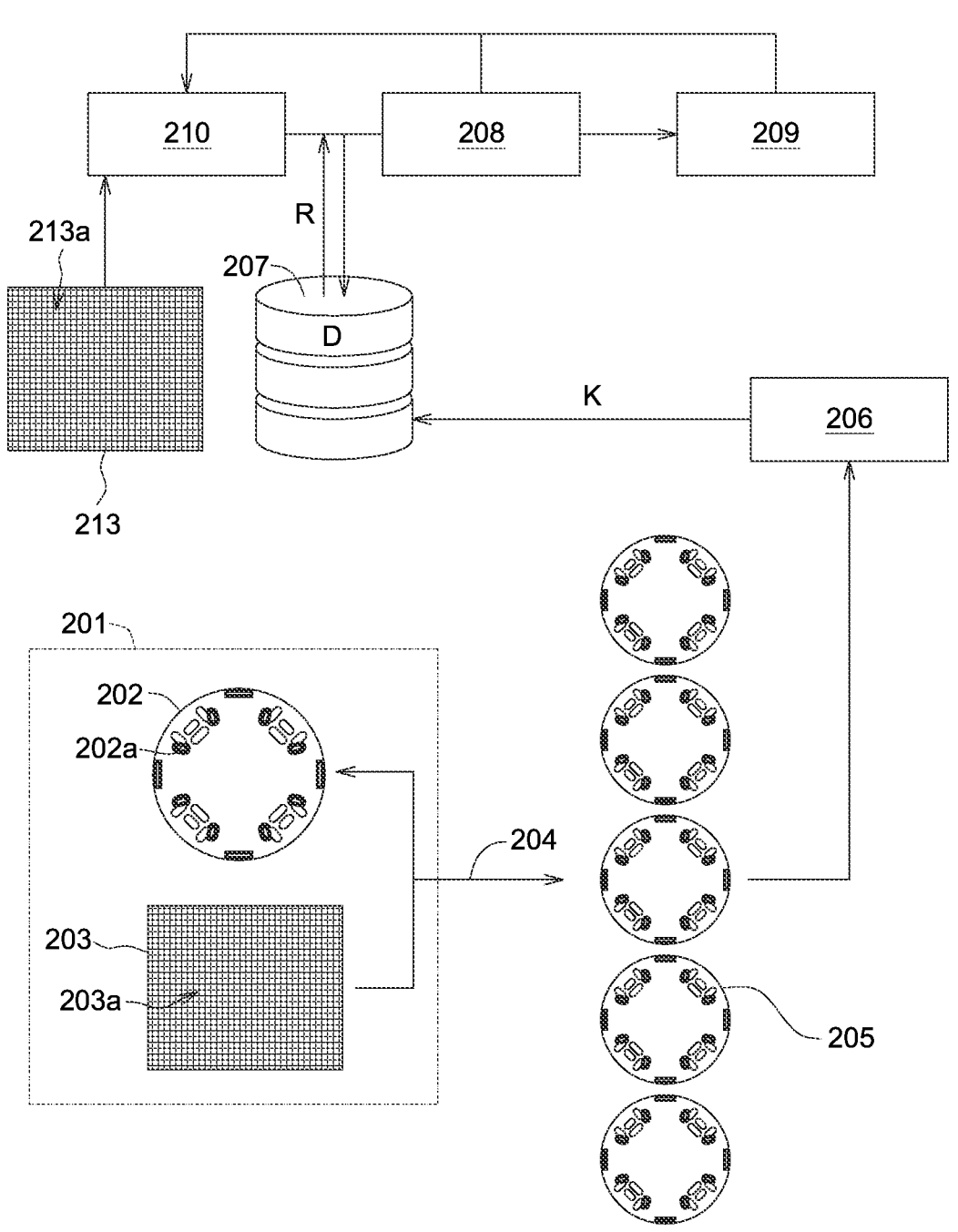
FIG. 2 is a block diagram illustrating a functional configuration of a lithography system for performing a mask patterns optical transfer according to one embodiment of the present disclosure.

The embodiments as illustrated below provide an optimization method of a mask patterns optical transfer to improve the process yield of a lithography process and reduce the manufacturing cost thereof. The present disclosure will now be described more specifically with reference to the following embodiments illustrating the structure and arrangements thereof.

It is to be noted that the following descriptions of preferred embodiments of this disclosure are presented herein for purpose of illustration and description only. It is not intended to be exhaustive or to be limited to the precise form disclosed. Also, it is important to point out that there may be other features, elements, steps, and parameters for implementing the embodiments of the present disclosure which are not specifically illustrated. Thus, the descriptions and the drawings are to be regard as an illustrative sense rather than a restrictive sense. Various modifications and similar arrangements may be provided by the persons skilled in the art within the spirit and scope of the present disclosure. In addition, the illustrations may not be necessarily drawn to scale, and the identical elements of the embodiments are designated with the same reference numerals.

The mask pattern optical transfer in the present disclosure may include the process of transferring the reticle pattern on the reticle to the photoresist layer coated on the wafer in the lithography process. In some embodiments of the present disclosure, the optimization method of the mask pattern optical transfer is performed to optimize the pupil configuration scheme (e.g., the aperture pattern layout of the pupil filter, aperture size, light source illumination energy or other parameters that may affect the diffraction of the reticle pattern) of an optical projection device in the lithography process system.

FIG. 1 is a processing flowchart illustrating an optimization method of a mask patterns optical transfer according to one embodiment of the present disclosure; and FIG. 2 is a block diagram illustrating a functional configuration of a lithography system 200 for performing a mask patterns optical transfer according to one embodiment of the present disclosure.

The optimization method for a mask pattern optical transfer, includes steps as follows: First, refer to step S11, a projection optical simulation 201 is performed to obtain an optimal pupil configuration scheme corresponding to a virtual mask pattern 203*a* of a virtual mask 203 (such as, a reticle). In some embodiments of the present disclosure, the projection optical simulation may include a source and mask optimization (SMO) step, through which a pupil configuration scheme of an optimal pupil filter 202 that is more suitable for the virtual mask pattern 203*a* of the virtual mask 203 (hereinafter referred to as the optimal pupil configuration scheme).

In some embodiments of the present disclosure, the so-called optimal pupil configuration scheme may include the shape, layout, size, and illumination intensity of the virtual light source (such as, virtual light beans) passing through the aperture pattern 202*a* of the optimal pupil filter 202, or other parameters of a projection optical device (not shown) used to provide virtual light beams that may affect the diffraction of the virtual light beans passing through the virtual mask pattern 203*a*.

Next, refer to step S12, a position scanning 204 is performed to change the optimal pupil configuration scheme, so as to generate a plurality of adjusted pupil configuration schemes 205. In some embodiments of the present disclosure, the step of performing the position scanning 204 to change the optimal pupil configuration scheme includes scanning the optimal pupil filter 202 in a stepwise manner to divide the optimal pupil filter into a plurality of blocks; and partially changing the shape, layout or size, etc. of the opening pattern 202*a* in each of the plurality of blocks (or referred to as position parameters); and changing at least one optical parameter in the optimal pupil configuration scheme, at the same time. For example, gradually increasing or decreasing a preset value of a certain optical parameter in the optimal pupil configuration scheme, so as to obtain the plurality of adjusted pupil configuration schemes 205.

For example, in one embodiment, when the position scanning 204 is performed on the optimal pupil filter 202 in a stepwise manner, the optimal pupil filter 202 can be divided into 100 blocks. The shape, layout or size of the aperture pattern 202*a* in each block of the optimal pupil filter 202 can be changed, and each of the changed shape, layout or size of the aperture pattern 202*a* can be match four types of light source irradiation intensities which are gradually increased by the preset value of light source irradiation intensity in the optimal pupil configuration scheme, so as to obtain 400 (100×4) adjusted pupil configuration schemes 205.

Then, refer to step S13, a mask pattern transfer simulation 206 is performed to obtain a plurality of pupil configuration schemes-critical dimension relationship data corresponding to the virtual mask pattern 203. For example, in some embodiments of the present embodiments, a photolithography simulation is performed using a photomask microlithography simulation software (e.g., a Sentaurus™ Lithography (S-Litho)). In the mask pattern transfer simulation 206, the virtual light beams provided based on these adjusted pupil configuration schemes 205 are used one by one, to irradiate the virtual mask pattern 203*a* of the virtual mask (e.g., a virtual reticle) 203 to focus a virtual image projecting onto a virtual photoresist layer (not shown) coated on a virtual wafer (not shown), so as to transfer the virtual mask pattern 203*a* on the virtual photoresist layer (not shown). Then, a virtual measuring value K of the critical dimension corresponding to each of the adjusted pupil arrangement schemes 205 can be obtained by performing a virtual measurement. The virtual mask pattern 203*a* corresponding to the virtual mask (e.g., the reticle) 203 and its adjusted pupil configuration schemes 205 and the measuring value K of the critical dimension of the virtual image are stored in a data storage element 207.

Repeating step S11 to step S13, different virtual masks (not shown) are selected; and the mask patterns of these virtual masks (not shown) and the measuring value K of the critical dimension corresponding to the adjusted pupil configuration schemes can be obtained and stored in the data storage element 207. After accumulating enough data, a database D can be formed to characterize the tripartite relationships among these mask patterns, pupil configuration schemes and the critical dimension.

Subsequently, refer to step S14, an actual pupil configuration scheme suitable for an actual mask pattern 213*a* of an actual mask 213 is selected according to the plurality of pupil configuration schemes-critical dimension relationship data. In some embodiments of the present disclosure, when the mask pattern optical transfer is actually performed, the actual mask pattern 213*a* of the actual mask 213 that is currently undergoing the mask pattern optical transfer is compared with the relevant data of the tripartite relationship among these mask patterns, pupil configuration schemes and the critical dimension stored in the database D, so as to find the adjusted pupil configuration scheme 205 by which the best measuring value K of the critical dimension can be obtained to serve as the actual pupil configuration scheme R for transferring the actual mask pattern 213*a*.

Thereafter, refer to step S15, an actual mask pattern transfer is performed based on the actual pupil configuration scheme R. Various parameters of the lithography system 200 are set according to the actual pupil configuration scheme R, so as to provide at least one actual light beam (not shown) passing through the actual mask pattern 213*a* of the actual mask 213 to irradiate an actual photosensitive substrate (e.g., a photoresist layer (not shown) coated on an actual wafer (not shown)), so as to form an actual photosensitive pattern (not shown) on the actual photosensitive substrate, and to complete the optical transfer process of the actual mask pattern 213*a* of the actual mask 213.

In some embodiments of the present disclosure, the lithography system 200 can use a Feedback User Interface (FUI) system 210 to manage various conditions of the wafer in the alignment machine (not shown) during the actual mask pattern transfer process, such as to manage the beam energy intensity, focal length, exposure overlap compensation value, etc. during an exposure and development process 208. At the same time, compensation managements can be carried out for adjusting other operations (such as, lens heating, reticle heating, etc.) of the alignment machine (not shown).

After the exposure and development process 208, a critical dimension measurement 209 is performed. In some embodiments of the present disclosure, the critical dimension of the actual photosensitive pattern transferred to the actual wafer (not shown) can be measured by an after-develop inspection (ADI). At the same time, the dimensional gap or variation between the actual critical dimension of the mask pattern 213*a* of the actual mask 213 and the critical dimension transferred to the actual wafer (not shown) is also calculated, and the measuring results can be fed back to the FUI system 210 providing reference to adjust the parameters of the subsequent mask pattern photo transfer.

Since, the optimization of mask pattern optical transfer can be still achieved without applying the trial-and-error study of the prior art at the initial stage of mask pattern transfer, thus the operation procedures can be greatly simplifying, the material waste can be decreased, and the process yield can be improved. Such that the cost of the optical lithography process can be decreased.

In accordance with the aforementioned embodiments of the present disclosure, an optimization method for a mask pattern optical transfer is provided. Firstly, a projection optical simulation is performed to obtain an optimal pupil configuration scheme corresponding to a virtual mask pattern. Then, a position scanning is performed based on the optimal pupil configuration scheme to define a plurality of scanning positions on a pupil filter. And the parameters of the optimal pupil configuration scheme (for example, the shape and layout of the aperture pattern, the size or the illumination intensity of the light source, etc.) at each of the scanning positions are adjusted to obtain a plurality of adjusted pupil configuration schemes.

Then, a mask pattern transfer simulation is performed based on these adjusted pupil configuration schemes to obtain a plurality of pupil configuration schemes-critical dimension relationship data corresponding to the virtual mask pattern, and store them in a data storage. These steps are repeated to obtain a plurality of pupil configuration schemes-critical dimension relationship data corresponding to a plurality of other virtual mask patterns. After accumulating enough data, a database can be formed to characterize the tripartite relationships among these mask patterns, pupil configuration schemes and the critical dimension.

When an actual mask pattern transfer is carried out, an actual mask pattern to be transferred can be preliminarily prepared according to these tripartite relationships among these mask patterns, pupil configuration schemes and the critical dimension stored in the database, and a pupil configuration scheme more suitable for the actual mask pattern can be then selected for directly performing the actual mask pattern transfer.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An optimization method for a mask pattern optical transfer, comprising:

performing a projection optical simulation to obtain an optimal pupil configuration scheme corresponding to a virtual mask pattern;

performing a position scanning to change the optimal pupil configuration scheme, so as to generate a plurality of adjusted pupil configuration schemes;

performing a mask pattern transfer simulation to obtain a plurality of pupil configuration schemes-critical dimension relationship data corresponding to the virtual mask pattern;

selecting an actual pupil configuration scheme suitable for an actual mask pattern according to the plurality of pupil configuration schemes-critical dimension relationship data; and performing an actual mask pattern transfer based upon the actual pupil configuration scheme.

2. The optimization method according to claim 1, wherein the optimal pupil configuration scheme comprises a plurality of position parameters and a plurality of optical parameters corresponding to the plurality of position parameters.

3. The optimization method according to claim 2, wherein the projection optical simulation comprises a source and mask optimization (SMO) step.

4. The optimization method according to claim 2, wherein the step of the position scanning comprises correspondingly changing the plurality of optical parameters by increasing or decreasing preset values thereof according to the plurality of position parameters.

5. The optimization method according to claim 1, wherein the step of performing the mask pattern transfer simulation comprises providing at least one virtual light beam according to the adjusted pupil configuration schemes, passing through the virtual mask pattern to irradiate a virtual photosensitive substrate; and obtaining at least one virtual measuring values of a critical dimension of a virtual image projecting onto the virtual photosensitive substrate by performing a virtual measurement.

6. The optimization method according to claim 1, wherein the step of performing the actual mask pattern transfer comprises:

providing at least one actual light beam passing through an actual mask pattern of an actual mask to irradiate an actual photosensitive substrate, so as to form an actual photosensitive pattern on the actual photosensitive substrate; and measuring a critical dimension of the actual photosensitive pattern.

* * * * *